US012575056B2

(12) United States Patent
Aiello et al.

(10) Patent No.: US 12,575,056 B2
(45) Date of Patent: Mar. 10, 2026

(54) MULTI-LAYER FAN BASE

(71) Applicant: Apple Inc., Cupertino, CA (US)

(72) Inventors: Anthony J. Aiello, Santa Cruz, CA (US); Akash H. Thaker, Santa Clara, CA (US); Anton Talalayev, San Jose, CA (US); Ashkan Rasouli, San Jose, CA (US); Brett W. Degner, Menlo Park, CA (US); Jesse T. Dybenko, Santa Cruz, CA (US); Nicholas A. Rundle, San Jose, CA (US); Simon S. Lee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 144 days.

(21) Appl. No.: 18/416,821

(22) Filed: Jan. 18, 2024

(65) Prior Publication Data
US 2025/0240912 A1     Jul. 24, 2025

(51) Int. Cl.
*H05K 7/20*        (2006.01)
*H05K 1/02*        (2006.01)
(52) U.S. Cl.
CPC ......... *H05K 7/20172* (2013.01); *H05K 1/028* (2013.01); *H05K 7/20209* (2013.01); *H05K 2201/1009* (2013.01)
(58) Field of Classification Search
CPC .......... F04D 17/08; F04D 17/10; F04D 17/16; F04D 19/002; F04D 29/05; F04D 29/051; F04D 29/281; F04D 29/30; F04D 29/4226; F04D 29/522; F04D 29/703; H02K 3/46; H02K 5/04; H02K 5/06; H02K 5/1672; H02K 5/225; H02K 7/09; H02K 11/30; H02K 2205/03; H02K 2211/03; H05K 7/145; H05K 7/20172; H05K 7/20209; H05K 7/2039; H05K 7/20418; H05K 7/20409; H05K 1/028; H05K 2201/1009; H05K 5/213; H05K 5/0234; G06F 1/20
See application file for complete search history.

(56) References Cited

U.S. PATENT DOCUMENTS 6,315,529 B1 *  11/2001  Hu ....................... F04D 25/0613
                                                        417/423.1
6,400,053 B1 *   6/2002  Horng ................... H02K 1/187
                                                        310/67 R
7,695,256 B2 *   4/2010  Horng ................. F04D 25/0653
                                                        417/420
(Continued)

*Primary Examiner* — Amir A Jalali
(74) *Attorney, Agent, or Firm* — BAKERHOSTETLER

(57) ABSTRACT

A fan assembly includes a base with multiple layers with at least one layer formed from a relatively lightweight material to reduce the overall weight of the fan assembly. The base may include multiple metal layers and one or more core layers positioned between the metal layers. At least one of the core layers may include a PCB used to route electrical signals between components of the fan assembly and/or between components of an electronic device in which the fan assembly is positioned. Alternatively, at least one of the core layers may include a lightweight material (e.g., plastic) with a channel used to receive a flexible circuit. The base, having layers of different materials, may be lighter in weight as compared to a base consisting of a metal layer (or metal layers), while also substantially retaining flexural stiffness to counter against applied forces to the base.

16 Claims, 14 Drawing Sheets

(56) References Cited

U.S. PATENT DOCUMENTS

| | | | | |
|---|---|---|---|---|
| 8,608,463 | B2 * | 12/2013 | Huang ............... | H05K 7/20172 |
| | | | | 417/423.1 |
| 2006/0232148 | A1 * | 10/2006 | Chen ........................ | H02K 7/09 |
| | | | | 310/68 B |
| 2007/0114869 | A1 * | 5/2007 | Horng ................. | F04D 25/0653 |
| | | | | 310/156.32 |
| 2007/0176508 | A1 * | 8/2007 | Kasai ..................... | H02K 29/08 |
| | | | | 310/156.32 |
| 2007/0196221 | A1 * | 8/2007 | Horng ................. | F04D 25/0653 |
| | | | | 417/420 |
| 2007/0217149 | A1 * | 9/2007 | Horng ................... | F04D 29/582 |
| | | | | 361/695 |
| 2009/0016914 | A1 * | 1/2009 | Chen ..................... | F04D 29/626 |
| | | | | 417/423.7 |
| 2010/0259115 | A1 * | 10/2010 | Horng ................... | H02K 5/163 |
| | | | | 310/51 |
| 2013/0121830 | A1 * | 5/2013 | Lee ........................ | F04D 29/646 |
| | | | | 29/889.6 |
| 2016/0126795 | A1 * | 5/2016 | Chen ..................... | H02K 11/33 |
| | | | | 310/68 R |
| 2018/0070472 | A1 * | 3/2018 | Aiello ..................... | F04D 17/16 |
| 2024/0164051 | A1 * | 5/2024 | Hsu .................... | H05K 7/20172 |

* cited by examiner

100

102

106

104

112a

112b

110

108

500

PROVIDE A FIRST LAYER AND A SECOND LAYER ~ 502

COUPLE A CORE LAYER WITH THE FIRST LAYER AND THE SECOND LAYER ~ 504

COUPLE ONE OR MORE LAYERS WITH THE FIRST LAYER, THE SECOND LAYER, AND THE CORE LAYER ~ 506

MULTI-LAYER FAN BASE

TECHNICAL FIELD

This application is directed to fans (e.g., fan assemblies) for electronic devices, and more particularly, to fans with a fan base that includes multiple layers of materials contributing a reduced weight of the fan.

BACKGROUND

An electronic device, including a portable electronic device, may include a fan used to drive heated exhaust air away from circuitry and out of the electronic device. The fan may include a motor used to drive several impeller blades. In order to drive the impeller blades, the motor is electrically coupled to a circuit (e.g., flex circuit) that is routed around one or more components of the fan. For example, the flexible circuit may extend along an outer surface of a fan base of the fan.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1:
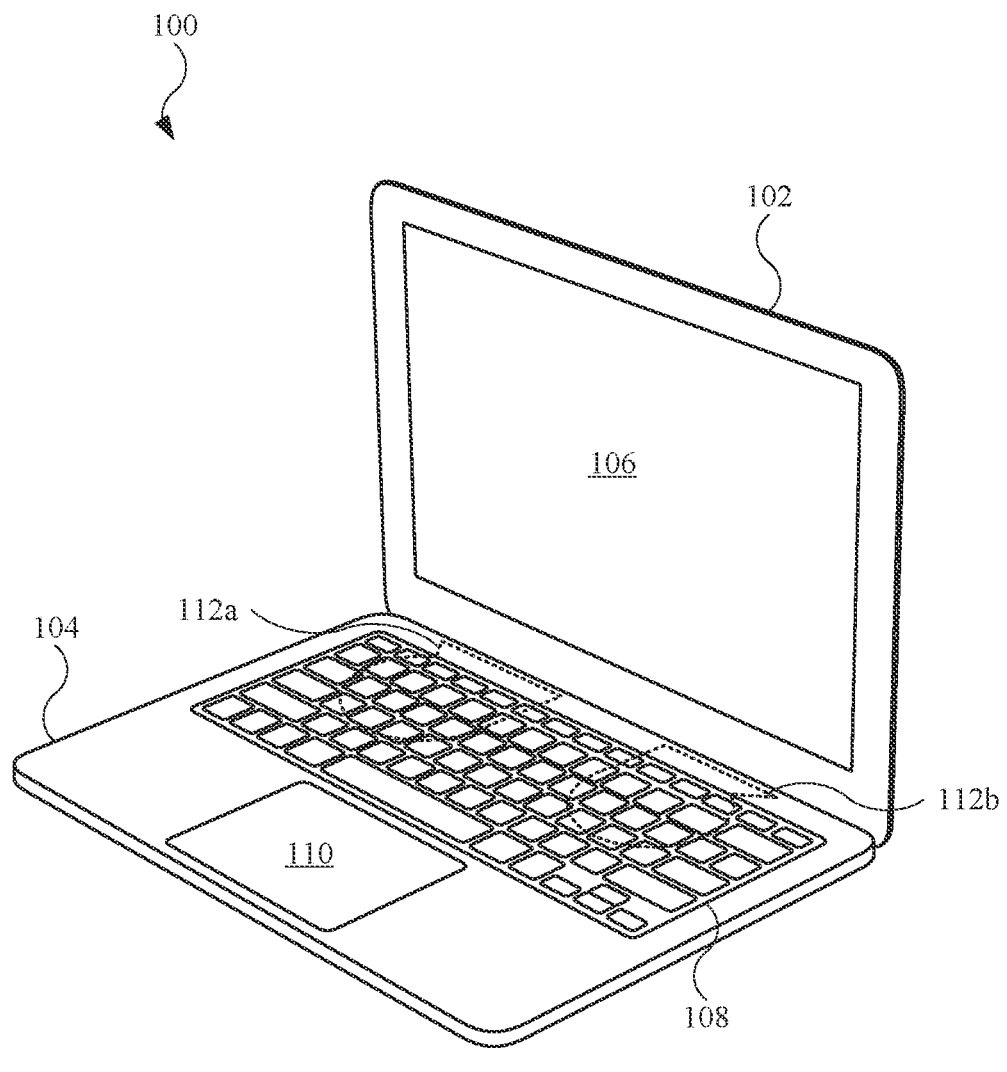
FIG. 1 illustrates a perspective view of an example of an electronic device, in accordance with aspects of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

The present disclosure is directed to reducing weight of electronic devices by reducing the weight of some components of an electronic device. In particular, a base, or pillow, of a fan assembly (e.g., blowers, air movers) includes multiple layers of different or dissimilar materials, while contributing to reducing the overall weight of the fan assembly. In one or more implementations, the base includes multiple metal layers that limit or prevent deflection of the base by a user of the electronic device, particularly at the center, or central location, of the base. For example, the fan assembly may be coupled to a keyboard assembly, thus placing the fan assembly in a location (e.g., keyboard) in which the user interacts with the electronic device and provides an applied force to the fan assembly when pressing on a key of the keyboard assembly. By limiting or prevent deflection of the base, the metal layers may prevent an impeller of the fan assembly from contacting and rubbing against a cover of the fan assembly. Also, the base may include one or more core layers positioned between the metal layers. The core layer(s), having a relatively lighter weight, may replace one or more metal layers. Beneficially, the base may substantially maintain its flexural stiffness while providing a reduced weight (as compared to an all-metal base), thus reducing the overall weight of the fan assembly and the electronic device that includes the fan assembly. In an alternative, the core layer may also be made of metal, including a relatively lower density metal to reduce the overall weight of the base. Also, in order to bond the dissimilar layers of the base together, a cladding operation may be used. Using the cladding operation, at least some of the layers of the base may be extruded through a die and pressed or rolled together under pressure.

Also, in some exemplary implementations, at least one of the core layers includes a printed circuit board (PCB). By utilizing a PCB, the fan assembly may run various electrical connections through the PCB to connect and route electrical signals between components of the fan assembly, such as between a motor and a motor driver circuit. Moreover, the PCB may be used to route electrical signals between components external to the fan assembly, such as between a main logic board (MLB) and an another electrical component (e.g., another circuit board) of the electronic device. As a result of using a PCB-integrated fan base, the number of circuits (e.g., flexible printed circuits) may be reduced in an electronic device, as the base provides internal electrical connections.

In other example implementations, at least one of the core layers includes a lightweight material such as plastic, carbon fiber, and/or fiber glass, as non-limiting examples. A portion of the core layer may be removed to create a channel through which a flexible printed circuit passes to make electrical connections between components of the fan assembly. While material is removed from the core layer for the flexible circuit, the base may still include metal layers to provide flexural stiffness to limit or prevent deflection of the base. In yet another example implementation, the core layer may take the form of a hybrid core that includes both a flexible printed circuit and a lightweight material (e.g., plastic, carbon fiber, and/or fiber glass). The flexible printed circuit and the lightweight material may include corresponding connection features to connect the flexible printed circuit and the lightweight material together. The flexible printed circuit portion may be minimized but provide enough area to connect a fan motor to an exterior of the base, while the remaining portion is made from the lightweight material.

Fan assemblies described herein may offer additional advantages. For example, the cover and sidewall of the fan assembly may be separately formed and subsequently coupled together. By separately forming the cover and sidewall, the cover may be formed with a reduced thickness relative to that of the sidewall. In this regard, the cover may be separated from the impeller by a greater clearance. Beneficially, when the fan assembly is coupled with a component (e.g., keyboard, keyboard circuit board) subject to displacement during use, the impeller is less likely to rub against the cover and cause an unwanted rubbing noise. Moreover, using a base with several stacked layers may provide enhanced thermal performance. For example, bases described herein may include additional metal layers, which may increase the overall thermal conductivity. Further, when additional metal layers are used, the coefficient of thermal expansion may be tailored to meet desired criteria.

These and other embodiments are discussed below with reference to FIGS. 1-15. However, those skilled in the art will readily appreciate that the detailed description given herein with respect to these Figures is for explanatory purposes only and should not be construed as limiting.

FIG. 1 illustrates a perspective view of an example of an electronic device 100, in accordance with aspects of the present disclosure. In one or more implementations, electronic device 100 takes the form of a desktop computing device, a standalone display, a video streaming device, as non-limiting examples. In the exemplary implementation shown in FIG. 1, electronic device 100 takes the form of a laptop computing device. Electronic device 100 includes a display housing 102 and a base portion 104. Display housing 102 is rotationally coupled with base portion 104, thus allowing display housing 102 to rotate toward and away from base portion 104 from an open position (shown in FIG. 1) to a closed position in which display housing 102 covers base portion 104.

Display housing 102 includes a display 106 designed to present visual information in the form of textual information, still images (e.g., pictures), and/or motion images (e.g., video). Base portion 104 includes multiple input mechanisms, such as a keyboard 108 and a track pad 110. Although not shown, base portion 104 (or in some cases, display housing 102) carries multiple components, such as a central processing unit (CPU), a graphics processing unit (GPU), a system on a chip (SOC), an application specific integrated circuit (ASIC), one or more memory circuits, and flexible circuitry, as non-limiting examples.

Additionally, electronic device 100 may include one or more fan assemblies. For example, electronic device 100 includes a fan assembly 112a and a fan assembly 112b (each shown as dotted lines). Fan assemblies 112a and 112b may drive exhaust air away from heat-generating components of electronic device 100 or provide cool air to the heat-generating components. Non-limiting examples of heat-generating components of electronic device 100 include a CPU, a GPU, an SOC, or an ASIC. Also, in one or more implementations, fan assemblies 112a and 112b are coupled to a keyboard circuit (not shown in FIG. 1) used with keys of keyboard 108.

Figure 2:
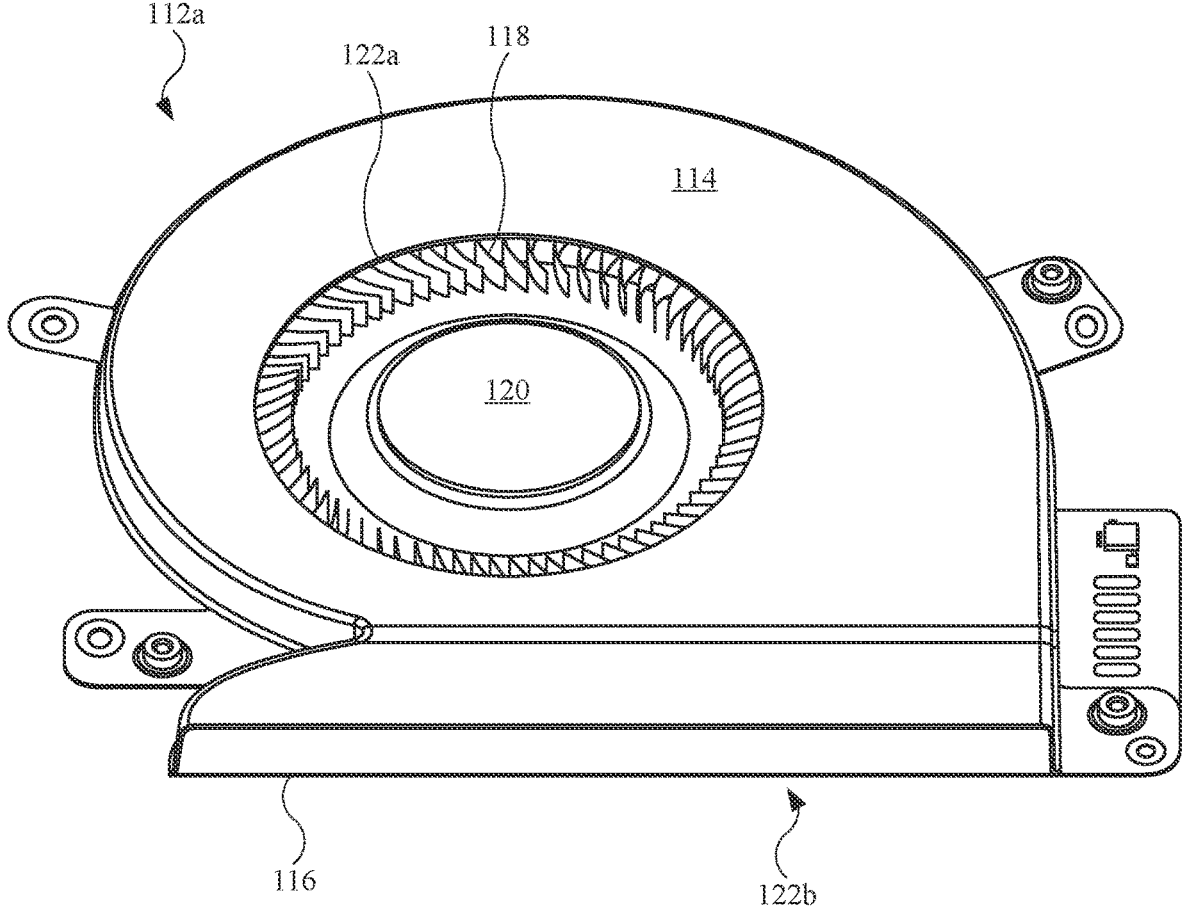
FIG. 2 illustrates a perspective view of an example of a fan assembly, in accordance with aspects of the present disclosure.

FIG. 2 illustrates a perspective view of an example of fan assembly 112a, in accordance with aspects of the present disclosure. The features and functions of fan assembly 112a described herein may be applicable to other fan assemblies shown and/or described herein, including fan assembly 112b (shown in FIG. 1). As shown, fan assembly 112a may include a cover 114 and a base 116 coupled to cover 114. Cover 114 and base 116 may combine to form in part a housing, or enclosure, of fan assembly 112a. In this regard, cover 114 and base 116 may enclose several components of fan assembly 112a including, but not limited to, an impeller 118 and a motor hub 120.

Cover 114 may include an opening 122a that defines a fan inlet for fan assembly 112a. Also, cover 114 and base 116 may combine to form an opening 122b that defines an air outlet for fan assembly 112a. Further, fan assembly 112a may include a motor (not shown in FIG. 2) designed to drive (e.g., rotationally drive) impeller 118 to drive air into fan assembly 112a via opening 122a and drive the air out of fan assembly 112a via opening 122b.

Figure 3:
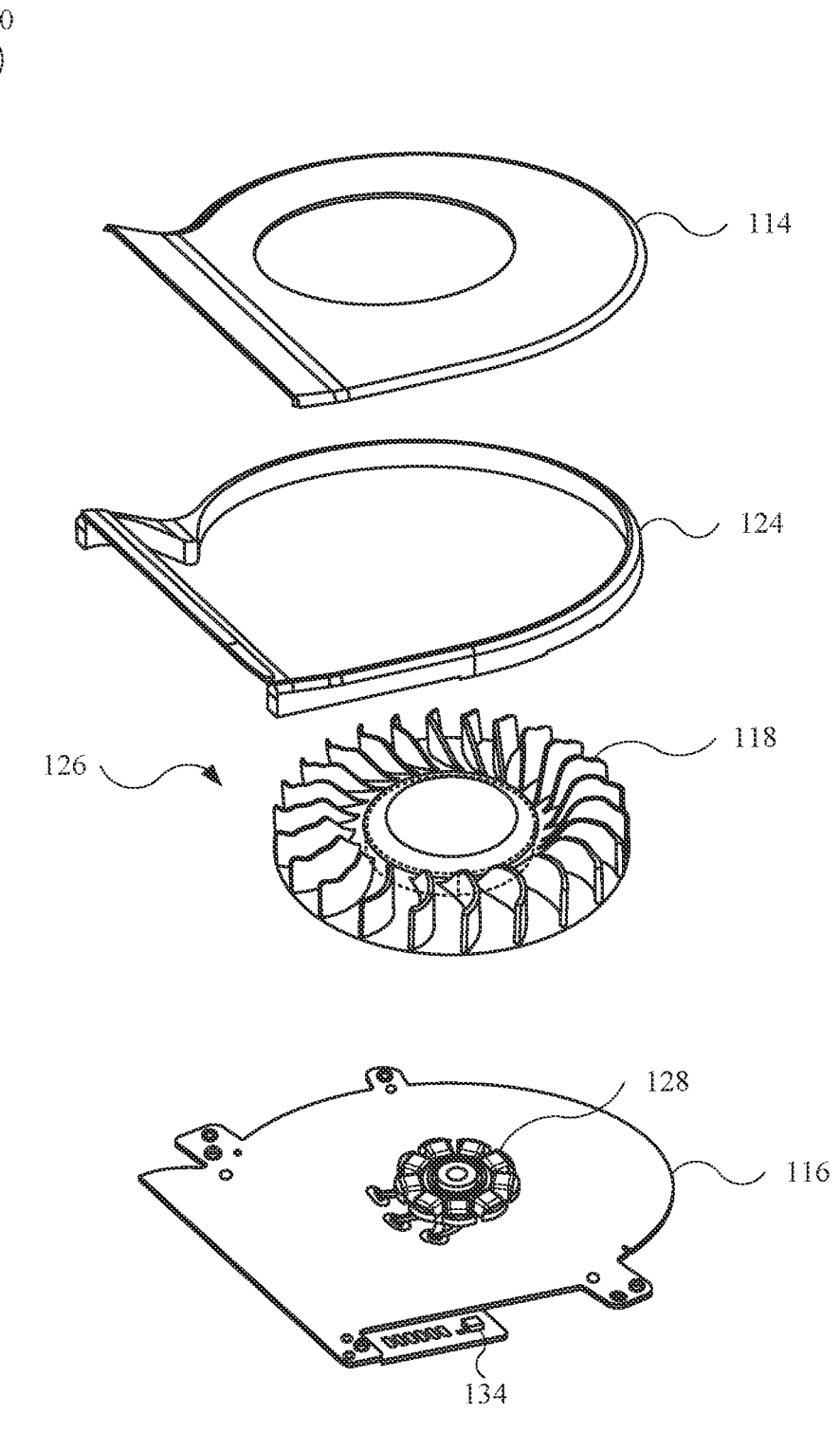
FIG. 3 illustrates an exploded view of a fan assembly, in accordance with aspects of the present disclosure.

FIG. 3 illustrates an exploded view of fan assembly 112a, in accordance with aspects of the present disclosure. In addition to cover 114, base 116, and impeller 118, fan assembly 112a may include additional components. For example, fan assembly 112a may include a sidewall 124. Sidewall 124 generally defines a perimeter of fan assembly 112a. Further, when assembled, sidewall 124 may be positioned between, and couple with, cover 114 and base 116.

Fan assembly 112a may further include a rotor 126 that include a series of magnets (e.g., permanent magnets) shown as dotted lines, with adjacent magnets having opposite magnetic polarity. As shown, impeller 118 is part of rotor 126. Although not expressly shown, rotor 126 may include additional parts (e.g., shaft, back iron). Fan assembly 112a may further include a stator 128 that includes a core and a wire that is wound several times around the core. Rotor 126 and stator 128 may combine to form a motor of fan assembly 112a, with the motor being used to drive impeller 118. As a non-limiting example, the motor may include a 3-phase direct current (DC) motor. As shown, rotor 126 is coupled to impeller 118 while stator 128 is coupled to base 116. In particular, rotor 126 may be coupled to a mounting structure (e.g., bushing, not shown in FIG. 3), with the mounting structure coupled to base 116.

Fan assembly 112a may further include a motor driver circuit 134 positioned on base 116. Motor driver circuit 134 may be used to control the speed of the motor, thus controlling the rotational speed of impeller 118. For example, motor driver circuit 134 may provide electrical current to stator 128, which causes stator 128 to function as an electromagnet. In this regard, stator 128 and rotor 126 may interact (e.g., through magnetic attraction and repulsion), which rotationally drives rotor 126 and impeller 118.

Figure 4:
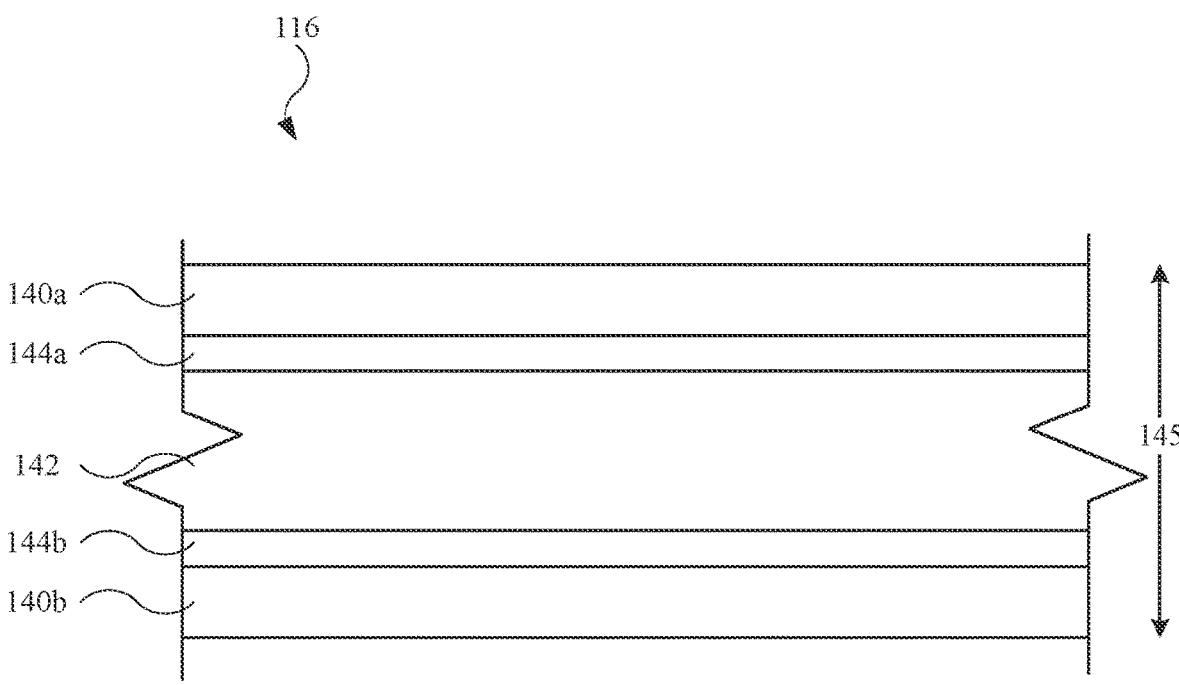
FIG. 4 illustrates an example of a base for a fan assembly, showing several layers of the base, in accordance with aspects of the present disclosure.

FIG. 4 illustrates an example of base 116 for a fan assembly 112a, showing several layers of base 116, in accordance with aspects of the present disclosure. As shown, base 116 includes a layer 140a and a layer 140b. Layers 140a and 140b may represent the outer or exterior region of base 116, and accordingly, each of layers 140a and 140b may be referred to as an exterior layer or an outer layer of base 116. In one or more implementations, each of layers 140a and 140b takes the form of a metal layer. For example, each of layers 140a and 140b may include steel, including stainless steel (e.g., SUS430 ferritic stainless steel). However, other metals are possible. Based on the material makeup of layers 140a and 140b, base 116 may include a flexural stiffness to resist bending forces that would otherwise cause impeller 118 (shown in FIG. 3) to contact and rub against cover 114 (shown in FIG. 3). Optionally, each of layers 140a and 140b may be coated or otherwise covered with a layer material to alter the appearance. This may include providing a coating that includes black for aesthetic purposes.

Also, base 116 may include a layer 142 positioned between layers 140a and 140b. Based on its central position in base 116, layer 142 may be referred to as a core layer. In one or more implementations, layer 142 takes the form of a PCB. In this regard, layer 142 may include electrical traces (not shown in FIG. 4) used to route signals (e.g., electrical signals) and/or power between various components. For example, layer 142 may route signals such as speed control, speed feedback, and communication signals between motor driver circuit 134 (shown in FIG. 3) and stator 128 (shown in FIG. 3). As a result, base 116 may run several interconnections internally without the need for an additional flexible circuit. Alternatively, layer 142 may include a material such as plastic, carbon fiber, and/or fiber glass, as non-limiting examples. Based on the exemplary materials for layer 142, layer 142 may include a relatively lightweight material, as compared to layers 140a and 140b, which are formed from metal. Beneficially, base 116 may provide a relatively lightweight structure, as compared to an all-metal base, while also providing some resistance to deflection or other bending forces.

Additionally, base 116 may include a layer 144a and a layer 144b. In one or more implementations, each of layers 144a and 144b takes the form of conductive layers. For example, each of layers 144a and 144b may take the form of an electrically conductive layer, including a thermally cured electrically conductive adhesive, as a non-limiting example. In this regard, layers 144a and 144b may provide an electrical grounding path for layer 140a and layer 140b, respectively, to layer 142. Alternatively, each of layers 144a and 144b may provide an electrical path for routing electrical signals to and/or from layer 142. Moreover, when layer 142 takes the form of a PCB, layer 142 may include exposed electrical traces (not shown in FIG. 4) that form an electrical grounding plane on opposing surfaces of layer 142. It should be noted that the number of layers and associated materials for base 116 is exemplary and the number of layers and/or described materials may vary in other examples.

While base 116 includes several layers of material, base 116 may nonetheless be relatively thin. For example, base 116 may include a dimension 145 (e.g., height) approximately in the range of 0.5 millimeters (mm) to 0.8 mm. In one or more implementations, dimension 145 is 0.6 mm, or approximately 0.6 mm.

Figure 5A:
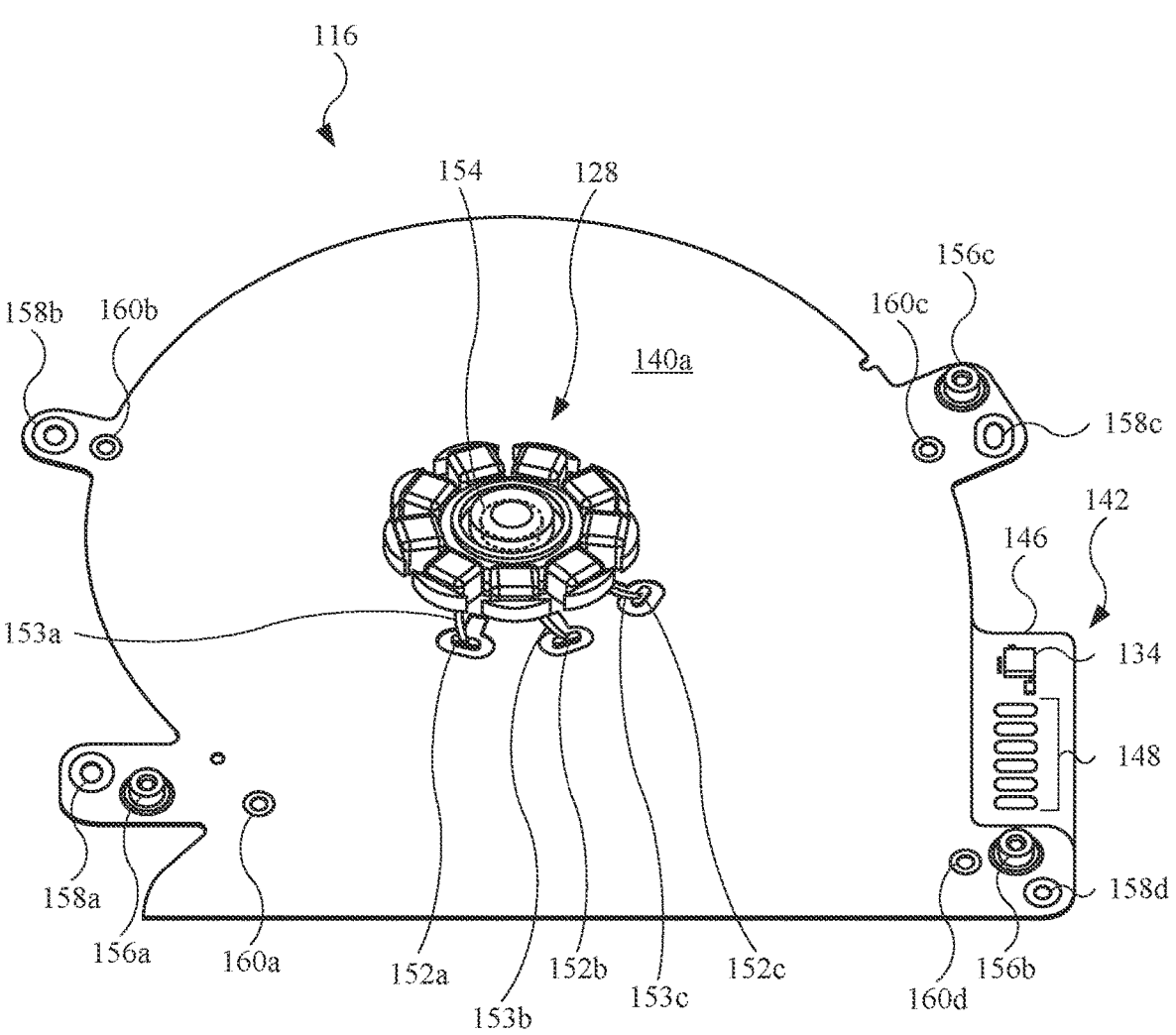
FIG. 5A and FIG. 5B illustrate examples of a subassembly for a base of a fan assembly, showing layouts of components positioned on the base, in accordance with aspects of the present disclosure.
Figure 5B:
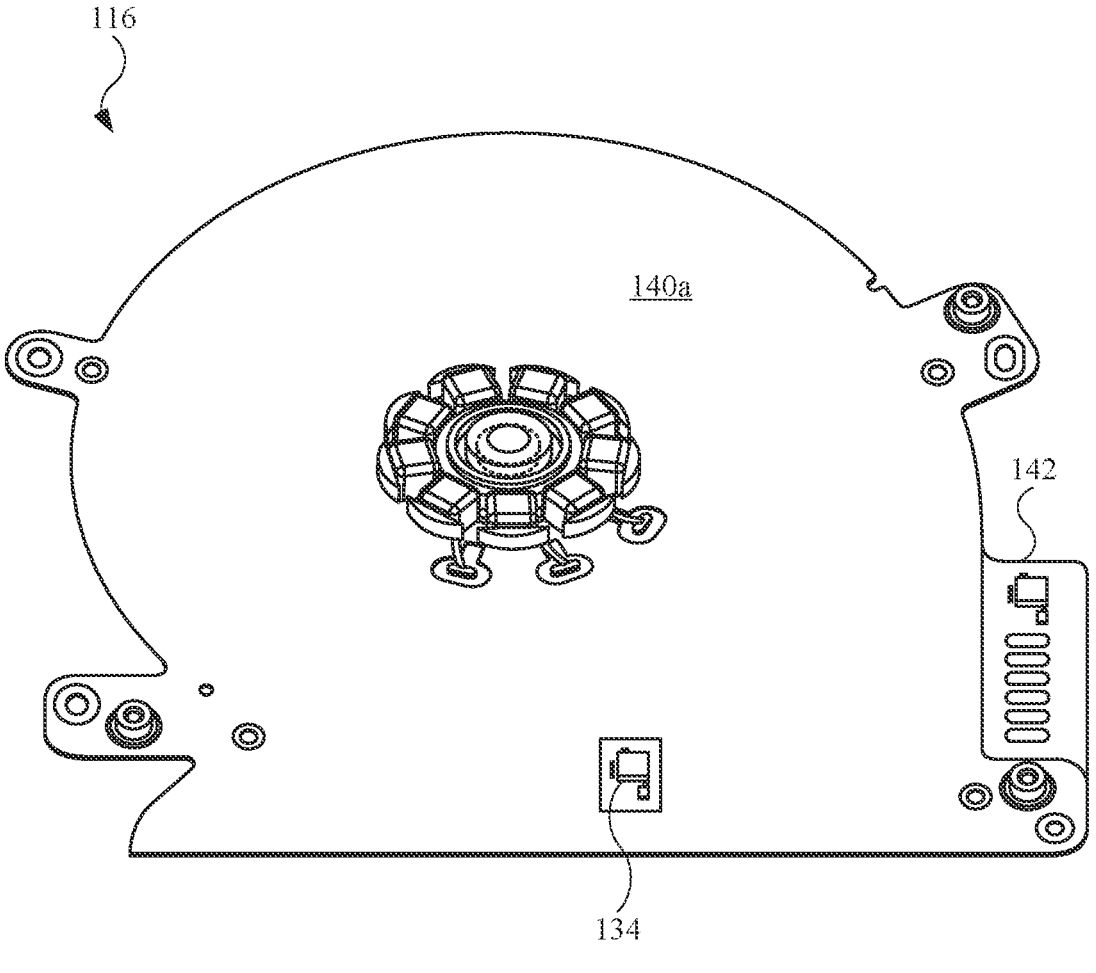

FIG. 5A and FIG. 5B illustrate examples of a subassembly for base 116 of fan assembly 112a (shown in FIG. 2), showing layouts of components positioned on base 116, in accordance with aspects of the present disclosure. Referring to FIG. 5A, base 116 may generally conform to the shape of cover 114 (shown in FIG. 2). In this regard, when base 116 includes a PCB (e.g., part of layer 142 shown in FIG. 4), base 116 includes a circuit board having a shape corresponding to fan assembly 112a (shown in FIG. 2). However, at least some layers of base 116 may differ to provide additional functionality. For example, layer 142 may extend (e.g., laterally extend) beyond a perimeter of layer 140a to provide an extended portion 146 for various components. Extended portion 146 of layer 142 may extend laterally with respect to layer 140a and provide a receiving surface for motor driver circuit 134. Additionally, extended portion 146 may provide a receiving surface for electrical contacts 148. As shown in FIG. 5A, electrical contacts 148 take the form of several pads (e.g., electrically conductive pads), each of which may be used as a terminal for an electrical connection to place a component (not shown in FIG. 5A) in electrical communication with the layer 142 (as a PCB). However, at least some of the electrical contacts 148 may be replaced by other connections, such as spring contacts (e.g., spring fingers), board-to-board connectors, pogo-pin connectors, or a combination thereof, as non-limiting examples.

Additionally, some portions of layer 140a may be removed to expose portions of layer 142. For example, base 116 may include an electrical contact 152a, an electrical contact 152b, and an electrical contact 152c. Electrical contact 152a, electrical contact 152b, and electrical contact 152c electrically coupled to a wire 153a, a wire 153b, and a wire 153c, respectively, of stator 128. In this regard, when layer 142 takes the form of a PCB, stator 128 may be in electrical communication with motor driver circuit 134. Beneficially, base 116 may replace one or more flexible circuits required for fan assembly 112a.

Base 116 may include multiple additional components and features. For example, base 116 may include a mounting structure 154 (shown as dotted lines) that receives stator 128. In one more implementations, mounting structure 154 takes the form of a bushing. Additionally, base 116 may include a mounting structure 156a, a mounting structure 156b, and a mounting structure 156c. In one or more implementations, each of mounting structures 156a, 156b, and 156c takes the form of a threaded mounting structure designed to receive a threaded fastener (not shown in FIG. 5A). In this regard, base 116 may be designed to carry, via mounting structures 156a, 156b, and 156c, a component such as a main logic board (not shown in FIG. 5A), as a non-limiting example. Also, portions of layer 140a may be removed and mounting structures 154, 156a, 156b, and 156c may couple with and directly contact layer 142. As a result, when layer 142 takes the form of a PCB, mounting structures 156a, 156b, and 156c may also serve as contact points for electrical grounding of a compound coupled to mounting structures 156a, 156b, and 156c. Also, mounting structure 154 may provide an electrical ground for rotor 126 (shown in FIG. 3).

Base 116 may include several openings that provide additional functionality. For example, base 116 may include an opening 158a, opening 158b, an opening 158c, and an opening 158d. As shown, each of openings 158a, 158b, 158c, and 158d is defined by a removal of layer 140a (representative of layer 140b (shown in FIG. 4)) and layer 142, with an additional portion of layer 140a being removed to expose layer 142. The exposed portions of layer 142 at openings 158a, 158b, 158c, and 158d may include an electrical contact pad to ground a mounting screw or to provide an electrical communication path. Also, base 116 may include an opening 160a, opening 160b, an opening 160c, and an opening 160d formed in layers 144a, 142, 144b, and 140b (shown in FIG. 4). In one or more implementations, each of openings 160a, 160b, 160c and 160d receives a fastener (not shown in FIG. 5A) that secures cover 114 (shown in FIG. 3) to base 116. An opening may also be formed in layer 140a that is aligned with respect openings of layers 144a, 142, 144b, and 140b. However, the opening in layer 140a may be relatively smaller. This will be shown in further detail below.

Referring to FIG. 5B, base 116 may include any features previously shown and/or described in FIG. 5A. However, base 116 may carry a component in other locations. For example, motor driver circuit 134 may be moved to, or approximately to, a portion of base 116 associated with a fan outlet (e.g., opening 122b shown in FIG. 2). Beneficially, air driven by a fan assembly that incorporates base 116 may drive air over and around motor driver circuit 134, thus providing cooling to motor driver circuit 134. It should be noted that a portion of layer 140a may be removed to electrically couple motor driver circuit 134 to layer 142.

Figure 6:
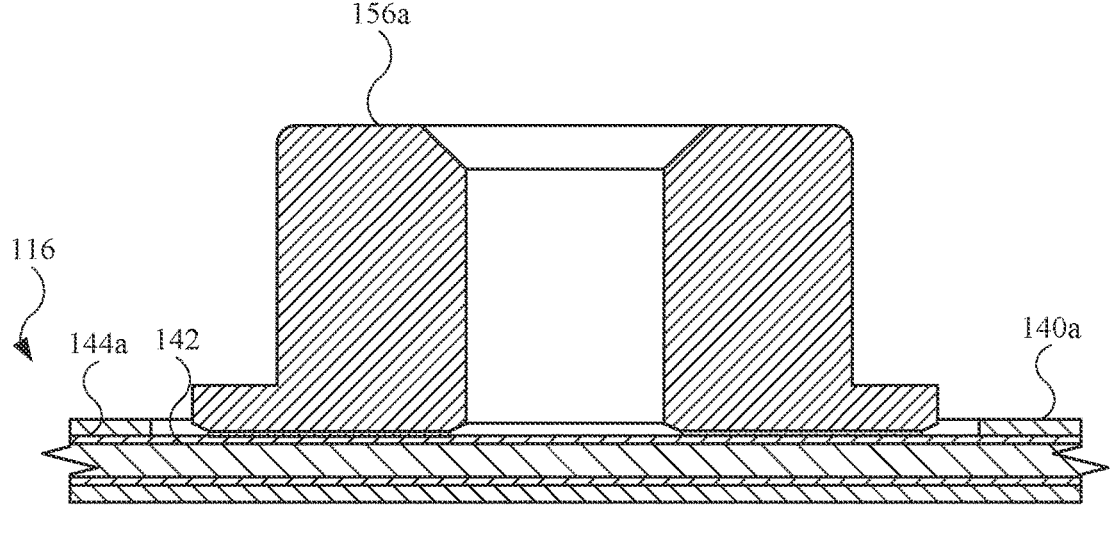
FIG. 6 illustrates a partial cross sectional view of an example of a mounting structure coupled to a base, in accordance with aspects of the present disclosure.

FIG. 6 illustrates a partial cross sectional view of an example of mounting structure 156a coupled to base 116, in accordance with aspects of the present disclosure. As shown, a portion of layer 140a and 144a is removed to expose layer 142. As a result, when layer 142 takes the form of a PCB, mounting structure 156a (representative of mounting structures 156b and 156c, shown in FIG. 5A) may secure to layer 142 via surface mount technology, thus electrically coupling mounting structure 156a with layer 142 and placing mounting structure 156a in electrical communication with at least some components electrically coupled to layer 142. As a non-limiting example, mounting structure 156a may be soldered to layer 142. As a result, mounting structure 156a may be used as an electrical connection to another circuit board (e.g., main logic board) or as a path for routing power to a motor of fan assembly 112a (shown in FIG. 2) or as a path for electrically grounding a part that is mounted to mounting structure 156a.

Figure 7:
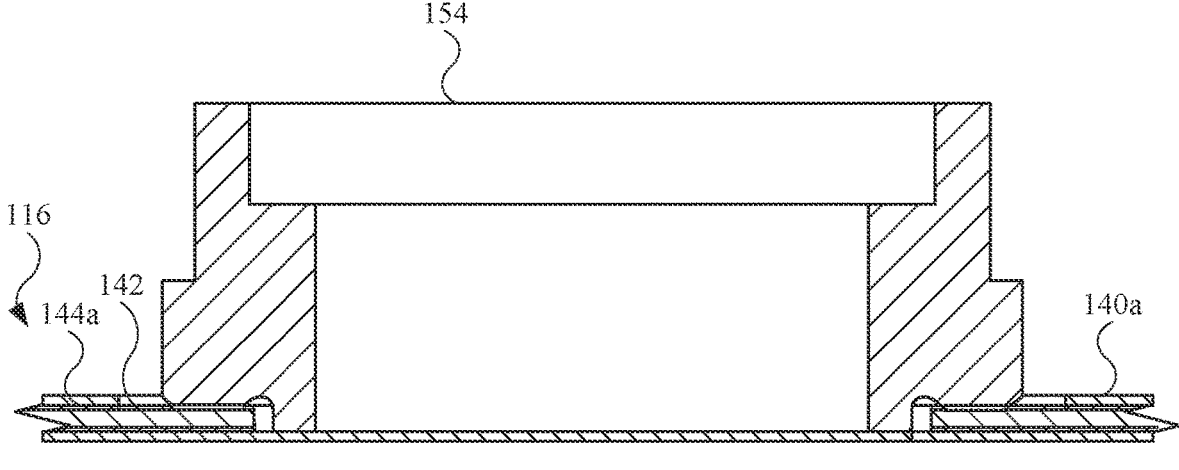
FIG. 7 illustrates a partial cross sectional view of an alternate example of a mounting structure coupled to a base, in accordance with aspects of the present disclosure.

FIG. 7 illustrates a partial cross sectional view of an alternate example of mounting structure 154 (e.g., bushing) coupled to base 116, in accordance with aspects of the present disclosure. Similar to the prior example shown in FIG. 6, a portion of layers 140a and 144a is removed to expose layer 142. As a result, when layer 142 takes the form of a PCB, mounting structure 154 may secure to layer 142 via surface mount technology, thus electrically coupling mounting structure 154 with layer 142. As a non-limiting example, mounting structure 154 may be soldered to layer 142. In one or more implementations, mounting structure 154 may function as a grounding path to ground a motor, including rotor 126 (shown in FIG. 3). Electrically grounding rotor 126 may serve to dissipate static electricity from the rotor 126 and/or impeller 118 (shown in FIG. 3). By utilizing surface mount technology, the connection of the aforementioned components may be consolidated into fewer processes, thus reducing manufacturing time.

Figure 8:
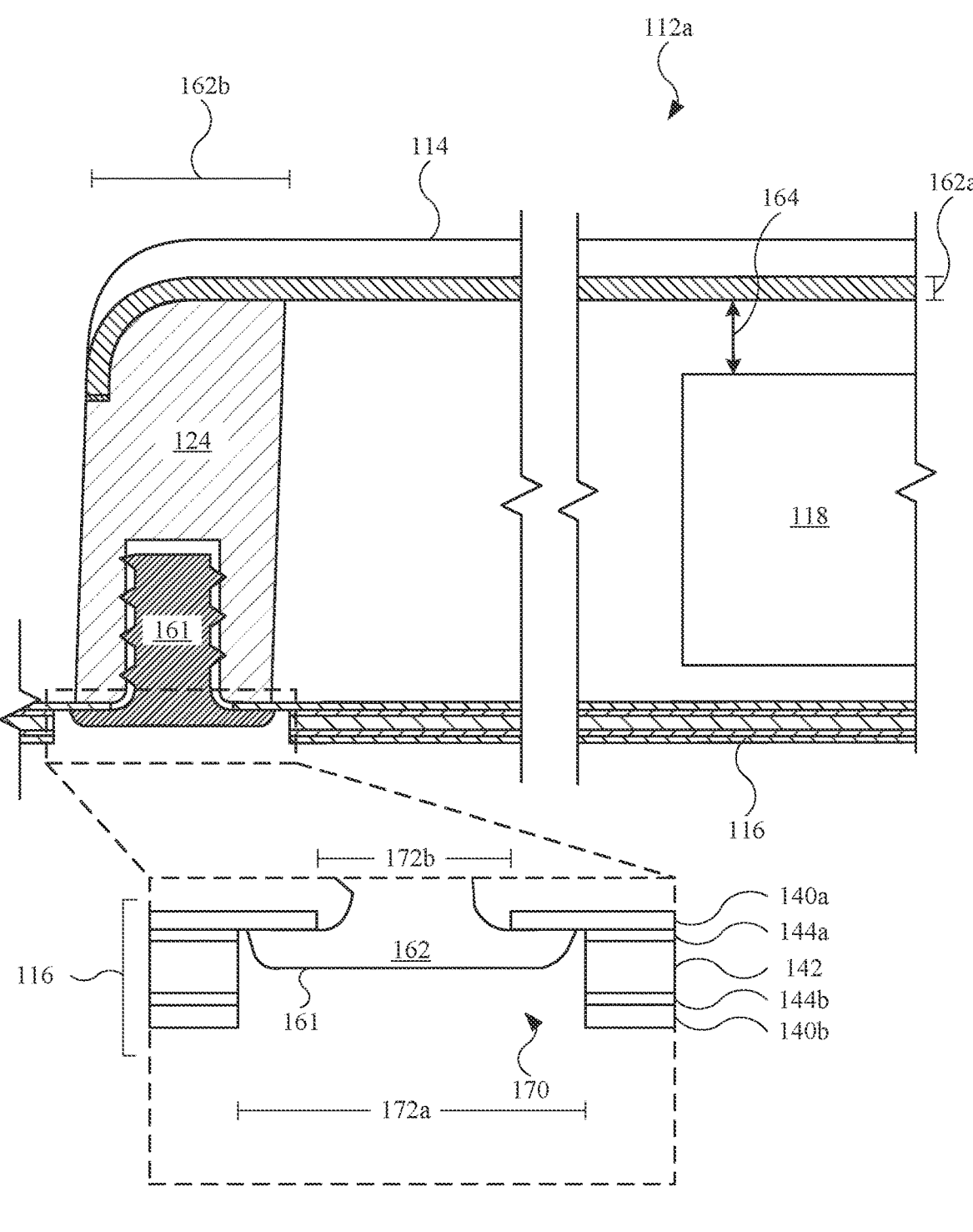
FIG. 8 illustrates a partial cross sectional view of an example of a cover and a sidewall of a fan assembly, showing the cover coupled to the sidewall, in accordance with aspects of the present disclosure.

FIG. 8 illustrates a partial cross sectional view of an example of a cover 114 and sidewall 124 of fan assembly 112a, showing cover 114 coupled to sidewall 124, in accordance with aspects of the present disclosure. Cover 114 and sidewall 124 may be coupled together by an adhesive, as a non-limiting example. Further, sidewall 124 may couple with base 116 by a fastener 161 (representative of one or more additional fasteners).

In one or more implementations, cover 114 is formed by a stamping operation and sidewall 124 is formed by a die-cast operation. However, other respective operations may be used. Based on the formation of cover 114 and sidewall 124 by separate processes, cover 114 and sidewall 124 may include different dimensional characteristics. For example, cover 114 may include a dimension 162a, or thickness, and sidewall 124 may include a dimension 162b, or thickness. As shown, dimension 162a is less than dimension 162b, thus making cover 114 a thinner structure. In this regard, cover 114 may be made thinner to promote a distance 164 (e.g., gap, separation) between cover 114 and impeller 118 that is greater than would otherwise be achieved if cover 114 was formed integrally with sidewall 124 using a single process (e.g., die casting) due to manufacturing limitations. Beneficially, an applied force to base 116 is less likely to cause impeller 118 to contact and rub against cover 114 due to the increased clearance represented by distance 164. Further, in some instances, distance 164 may be reduced based upon dimension 162a of cover 114 to reduce the overall height of fan assembly 112a, thus allowing to fan assembly 112a to be implemented in a relatively lower profile electronic device.

Additionally, as shown in the enlarged view, base 116 includes an opening 170 that receives fastener 161, including a fastener head 162 of fastener 161. Also, opening 170 is defined by respective openings of layers 140a, 140b, 142, 144a, and 144b. The respective openings of layers 140b, 142, 144a, and 144b are defined by a dimension 172a (e.g., diameter), while the opening of layer 140a is defined by a diameter 172b. As shown, dimension 172a is greater than diameter 172b. Moreover, dimension 172a is greater than a diameter (not labeled) of fastener head 162 while diameter 172b is less than the diameter of fastener head 162. As a result, when fastener 161 passes through opening 170, fastener head 162 clamps (or otherwise engages) with layer 140a to attach sidewall 124 to base 116. Based on the dimensions of opening 170, additional operations (e.g., machining operations) may not be required for base 116 to accommodate fastener 161. Further, as shown in FIG. 8, fastener head 162 is recessed in opening 170, thus maintaining fastener 161 sub-flush with respect to base 116 (e.g., sub-flush with at least layer 140b of base 116). Beneficially, fastener 161 does not occupy additional space external to a fan assembly (e.g., fan assembly 112a shown in FIG. 2).

FIGS. 9-13 show and describe alternative examples of fan assemblies. The fan assemblies shown and/or described in FIGS. 9-13 may include at least some features previously shown and described for a fan assembly and a base of a fan assembly. Also, in some instances, fan assemblies previously shown and/or described may be modified to include in several features shown and described in FIGS. 9-13.

Figure 9:
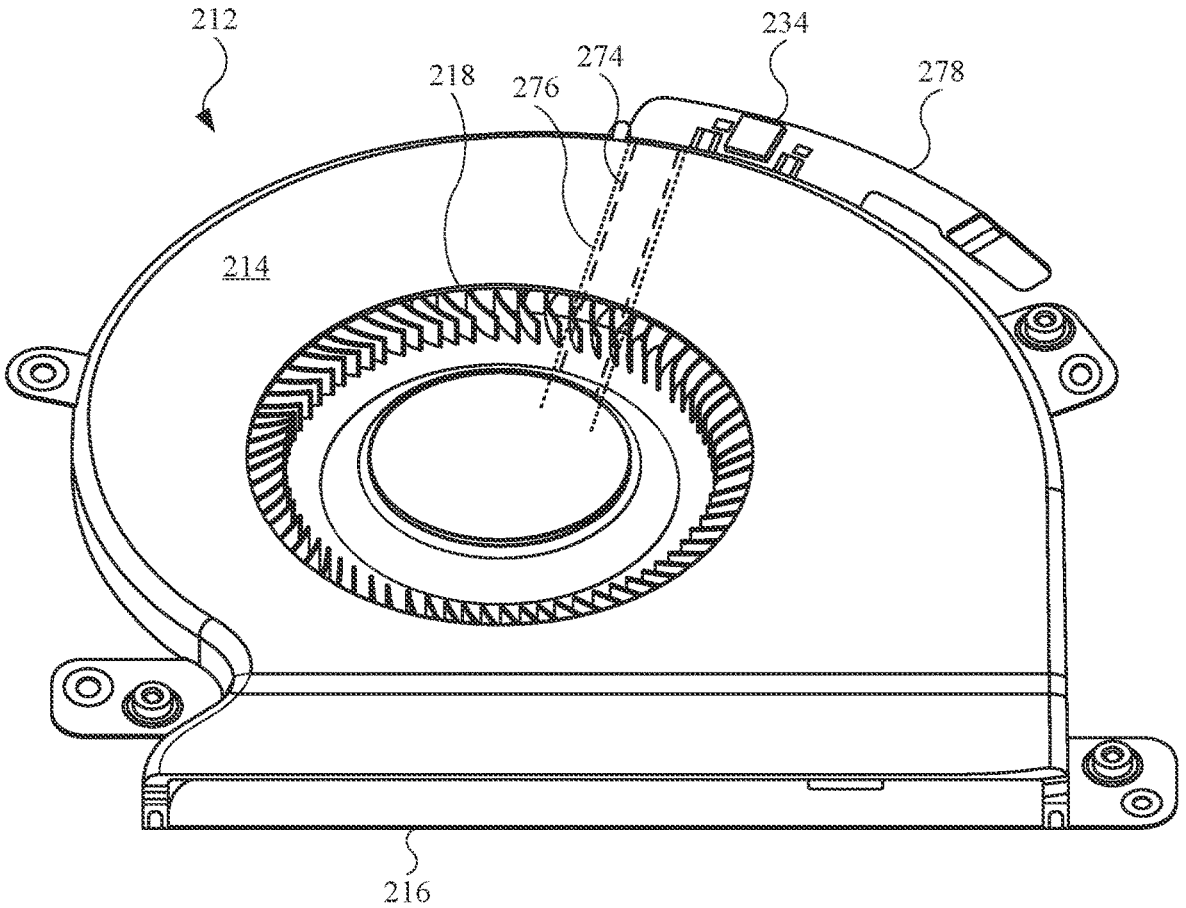
FIG. 9 and FIG. 10 illustrate perspective views of an alternate embodiment of a fan assembly, showing a circuit passing through a channel of a base, in accordance with aspects of the present disclosure.
Figure 10:
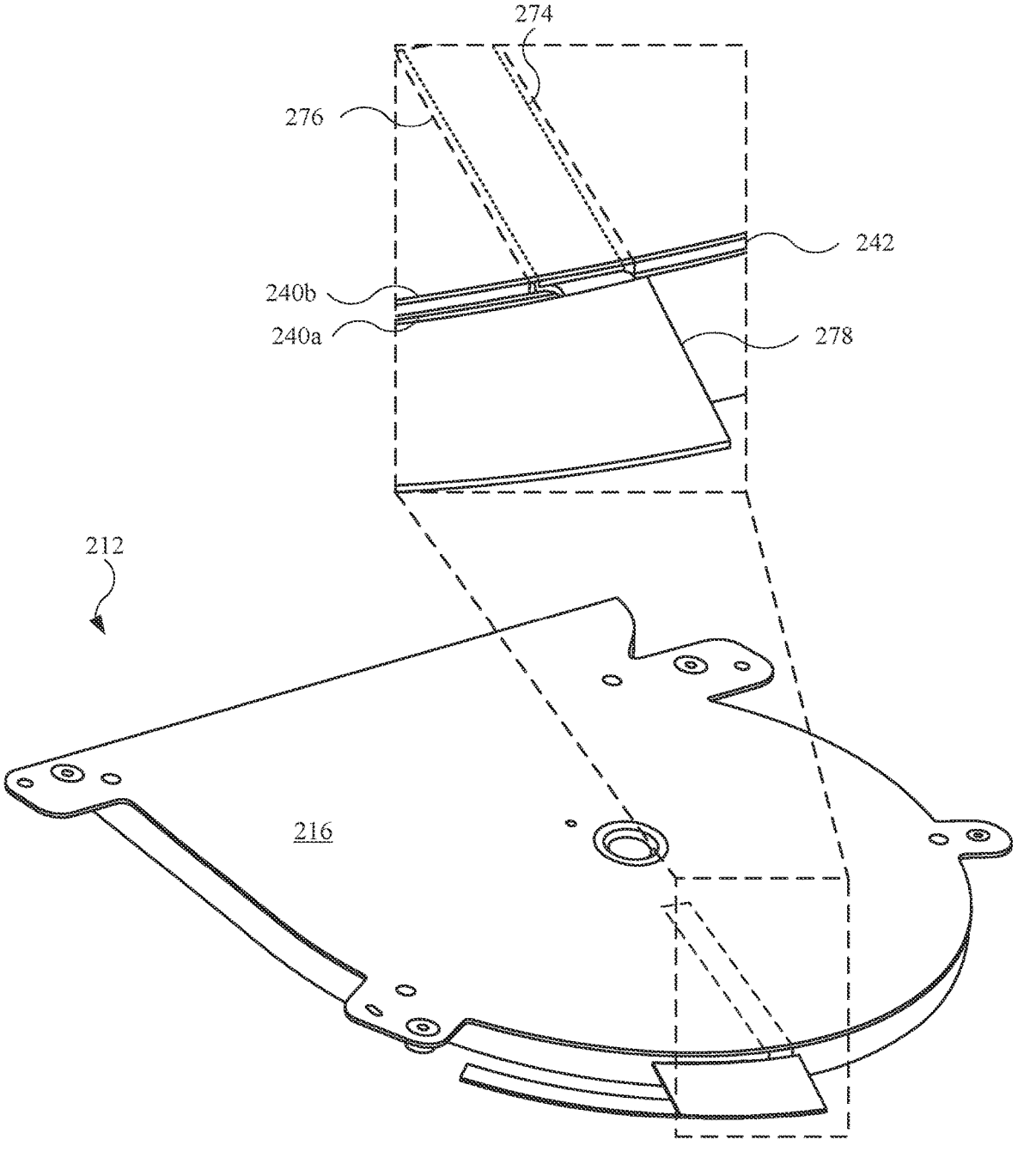

FIG. 9 and FIG. 10 illustrate a perspective view of an alternate embodiment of a fan assembly 212, showing a circuit 274 passing through a channel 276 of a base 216, in accordance with aspects of the present disclosure. Referring to FIG. 9, fan assembly 212 may include various features for a fan assembly, including, but not limited to, a cover 214, a base 216, an impeller 218, and a motor within the central hub of impeller 218 (not shown in FIG. 9). Additionally, fan assembly 212 may include a circuit 278 (e.g., flexible printed circuit or FPC) external to cover 214 and base 216, and a motor driver circuit 234 electrically connected to circuit 278.

In one or more implementations, circuit 274 takes the form of a flexible printed circuit. Also, circuit 274 may electrically couple to the motor of fan assembly 212 (including a stator) as well as to motor driver circuit 234. Circuit 274 may route electrical signals (e.g., speed control, speed feedback) from motor driver circuit 234 to the motor, as well as route power to the motor.

Referring to FIG. 10, fan assembly 212 is designed to receive circuit 274 through base 216. As shown in the enlarged view, base 216 may include a layer 242 (e.g., core layer, central layer), positioned between a layer 240a and a layer 240b of base 216, through which channel 276 is formed. As a result, circuit 274 may run through base 216 via channel 276, as opposed to around base 216. Beneficially, the overall footprint of fan assembly 212 may be reduced. Also, while channel 276 represents a removal of material in base 216, other layers (e.g., layers 240a and 240b) may take the form of metal layers, thus providing sufficient flexural stiffness to limit or prevent forces applied to base 216 that would otherwise cause base 216 to deflect and subsequently cause impeller 218 (shown in FIG. 10) contact and rub against cover 214 (shown in FIG. 9). In this regard, the bending moment and stress of base 216 is relatively higher at the outer layers (e.g., layers 240a and 240b) as compared to that of the core layer (e.g., layer 242). As a result, the layer 242 is less critical with respect to bending resistance and providing flexural stiffness as compared to that of layers 240a and 240b, and portions (e.g., channel 276) may be removed from layer 242 without significantly affecting the bending resistance and flexural stiffness of base 216.

Figure 11:
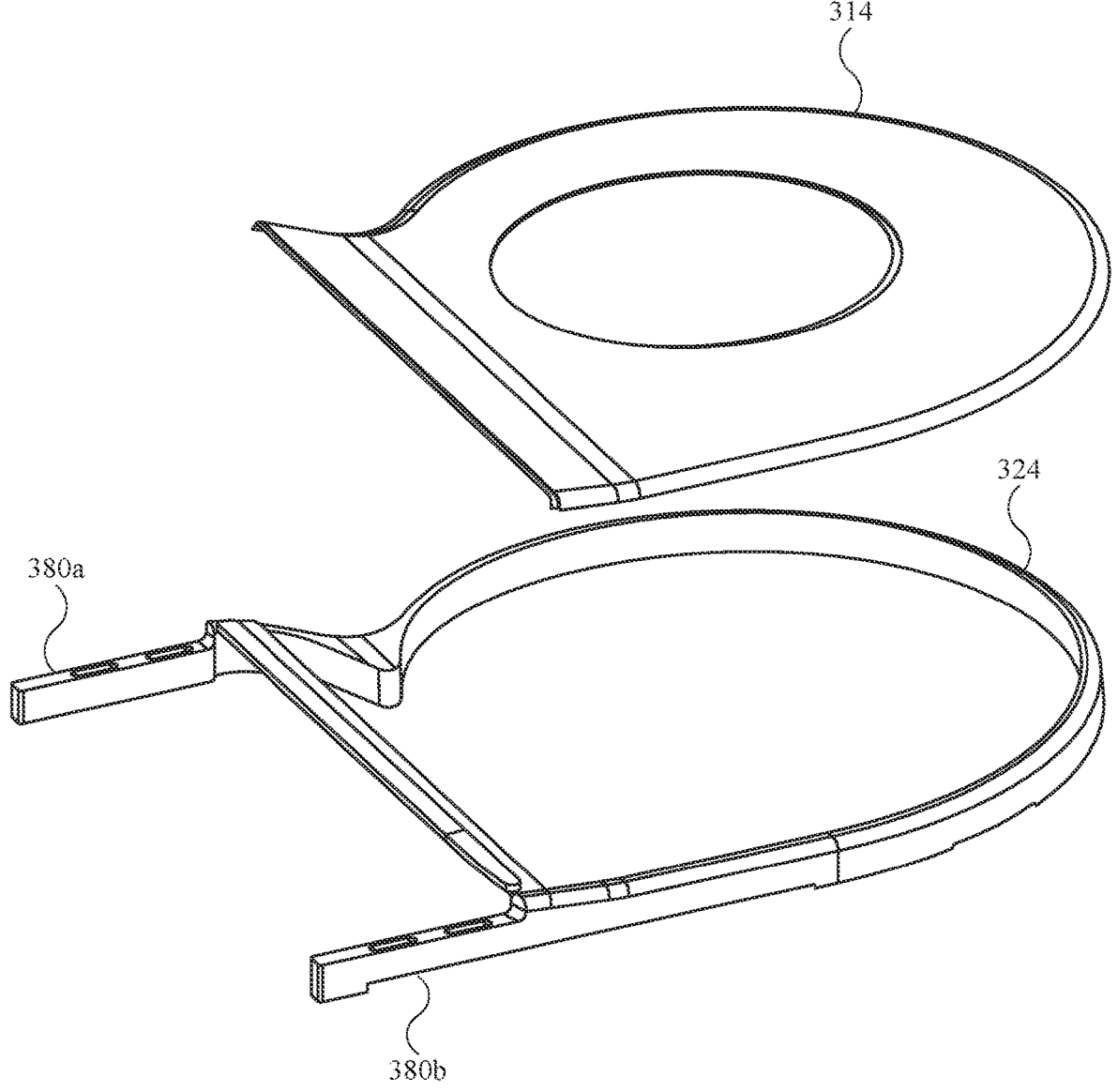
FIG. 11 illustrates a perspective view of a cover and a sidewall for a fan assembly, showing an alternate embodiment of a sidewall, in accordance with aspects of the present disclosure.

FIG. 11 illustrates a perspective view of a cover 314 and a sidewall 324 for a fan assembly, showing an alternate embodiment of sidewall 324, in accordance with aspects of the present disclosure. As shown, sidewall 324 may include a wall 380a and a wall 380b. Walls 380a and 380b may function as part of a duct system to direct air exiting a fan assembly in a particular direction.

Figure 12:
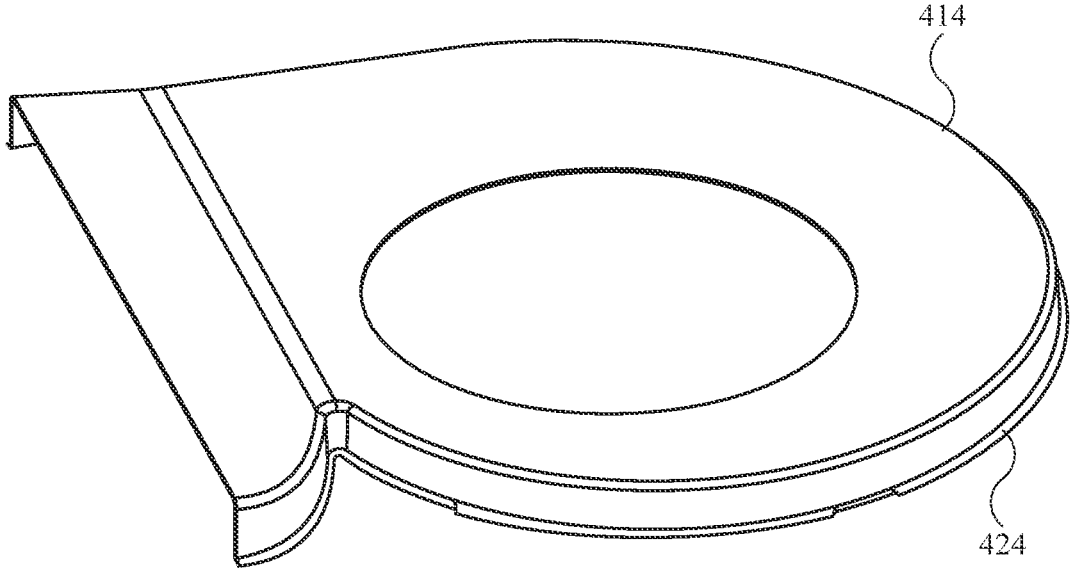
FIG. 12 illustrates a perspective view of an alternate embodiment of a cover, showing a sidewall integrated with the cover, in accordance with aspects of the present disclosure.

FIG. 12 illustrates a perspective view of an alternate embodiment of a cover 414, showing a sidewall 424 integrated with cover 414, in accordance with aspects of the present disclosure. In one or more implementations, cover 414 is formed by a stamping operation in which a material (e.g., metal) is stamped, drawn or impact-extruded, thus forming sidewall 424. Based on cover 414 and sidewall 424 being formed form the same material, the material thickness of cover 414 and sidewall 424 may be the same or substantially similar. As a result, sidewall 424 may be thinner than prior examples of sidewalls. This may contribute to less overall weight of a fan assembly.

Figure 13:
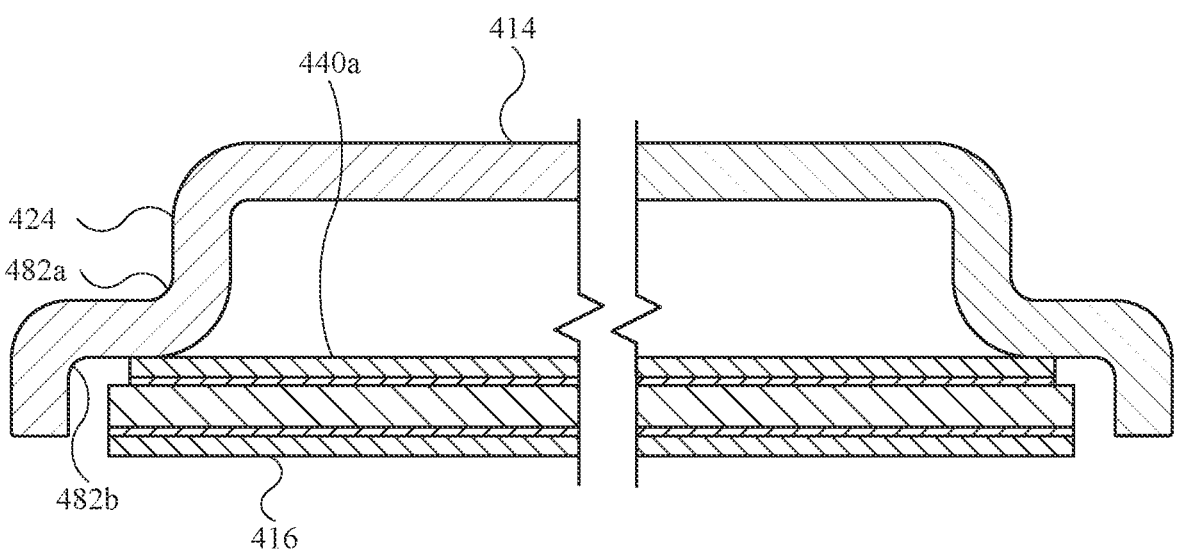
FIG. 13 illustrates a partial cross sectional view of a cover coupled with a base, in accordance with aspects of the present disclosure.

FIG. 13 illustrates a partial cross sectional view of cover 414 coupled with a base 416, in accordance with aspects of the present disclosure. As shown, sidewall 424 of cover 414 may include a bend 482a to provide a receiving surface for a base 416, with the receiving surface providing a surface to which base 416 is coupled with sidewall 424 by an adhesive, as opposed to fasteners in a prior example. Also, sidewall 424 may include a bend 482b (e.g., inner bend) that causes sidewall 424 to laterally cover base 416. In one or more implementations, base 416 is modified to conform to cover 414, including sidewall 424. For example, as shown in FIG. 13, a layer 440a (e.g., top layer of base 416) may be reduced in dimension, as compared to other layers, to avoid contact with locations corresponding to bend 482b.

Figure 14:
FIG. 14 illustrates a flow diagram showing an example of a process that may be performed for assembling a base for a fan assembly, in accordance with aspects of the present disclosure.
Figure 14:
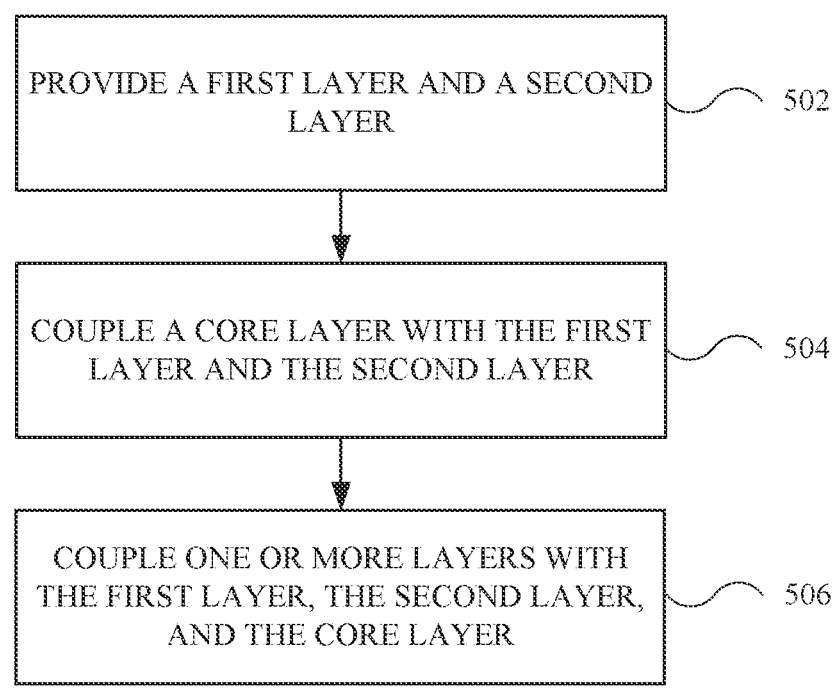

FIG. 14 illustrates a flow diagram showing an example of a process 500 that may be performed for assembling a base for a fan assembly, in accordance with aspects of the present disclosure. For explanatory purposes, process 500 shown in FIG. 14 is primarily described herein with reference to bases for fan assemblies, which may include base 116 (shown in FIG. 2). However, process 500 shown in FIG. 14 is not limited to base 116, and one or more blocks (or operations) of process 500 may be performed to assemble one or more other bases shown and/or described herein. Further, for explanatory purposes, some of the blocks of process 500 are described herein as occurring in serial, or linearly. However, multiple blocks of process 500 may occur in parallel. In addition, the blocks of process 500 need not be performed in the order shown and/or one or more blocks of process 500 need not be performed and/or can be replaced by other operations.

At block 502, a first layer and a second layer are provided. In one or more implementations, the first layer and the second layer each take the form of a metal layers.

At block 504, a core layer is coupled with the first layer and the second layer. In one or more implementations, the core layer is coupled with the first layer and the second layer through a cladding operation. Also, in order to bond the layers of the base together using the cladding operation, at least some the layers of the base may be extruded through a die and pressed or rolled together under pressure. In this regard, multiple surfaces of the core layer may be covered by the first layer and the second layer.

In some example implementations, the core layer takes the form of several different structures. For example, in one or more implementations, the core layer takes the form of a PCB, thus allowing the core layer to route several electrical signals. In this case, the core layer is bonded to the first and second layers using an adhesive. Alternatively, in one or more implementations, the core layer takes the form of plastic, carbon fiber, and/or fiber glass, as non-limiting examples. The core layer, when not a PCB, may include a channel that provides a space for a circuit to pass therethrough. In this regard, the base may allow the circuit to pass between the first metal layer and the second metal layer.

At block 506, one or more layers are coupled with the first layer, the second layer, and the core layer. In one or more implementations, the layers are conductive layers (e.g., electrically conductive layers). In this regard, the layers may include a first conductive layer may couple with the first layer and a first surface of the core layer. Further, the layers may include a second conductive layer may couple with the second layer and a second, opposing layer of the core layer. In one or more implementations, each of the first conductive layer and the second conductive layer takes the form of an electrically conductive layers designed to provide an electrical ground for the first layer and the second layer, respectively. In one or more implementations, the conductive layers take the form of conductive adhesive.

Figure 15:
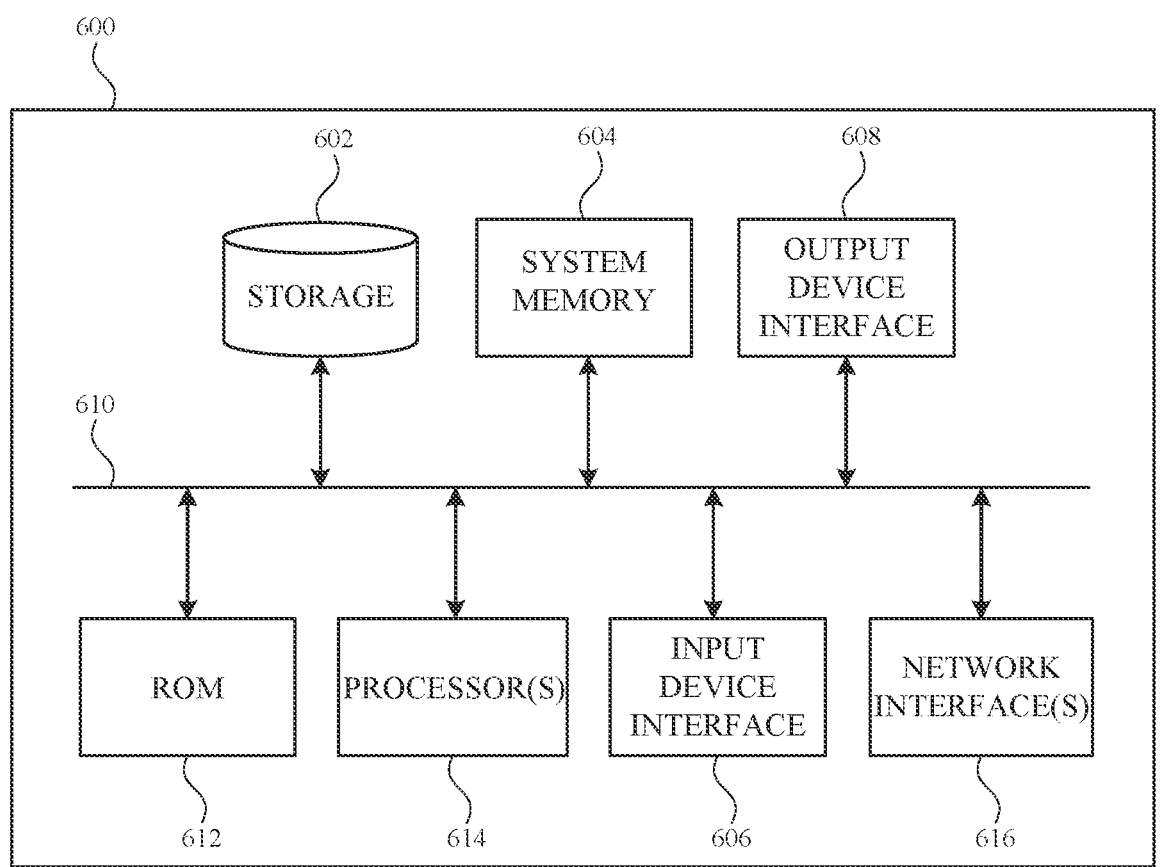
FIG. 15 illustrates an electronic system with which one or more implementations of the subject technology may be implemented.

FIG. 15 illustrates an electronic system with which one or more implementations of the subject technology may be implemented. The electronic system 600 can be, and/or can be a part of, the electronic device 100 as shown in FIG. 1. The electronic system 600 may include various types of computer readable media and interfaces for various other types of computer readable media. The electronic system 600 includes a bus 610, one or more processing units 614, a system memory 604 (and/or buffer), a ROM 612, a permanent storage device 602, an input device interface 606, an output device interface 608, and one or more network interfaces 616, or subsets and variations thereof. One or more of the components shown and described herein for the electronic system 600 may be optional.

The bus 610 collectively represents all system, peripheral, and chipset buses that communicatively connect the numerous internal devices of the electronic system 600. In one or more implementations, the bus 610 communicatively connects the one or more processing units 614 with the ROM 612, the system memory 604, and the permanent storage device 602. From these various memory units, the one or more processing units 614 retrieves instructions to execute and data to process in order to execute the processes of the subject disclosure. The one or more processing units 614 can be a single processor or a multi-core processor in different implementations.

The ROM 612 stores static data and instructions that are needed by the one or more processing units 614 and other modules of the electronic system 600. The permanent storage device 602, on the other hand, may be a read-and-write memory device. The permanent storage device 602 may be a non-volatile memory unit that stores instructions and data even when the electronic system 600 is off. In one or more implementations, a mass-storage device (such as a magnetic or optical disk and its corresponding disk drive) may be used as the permanent storage device 602.

In one or more implementations, an optional removable storage device (such as a flash drive, and its corresponding disk drive) may be used as the permanent storage device 602. Like the permanent storage device 602, the system memory 604 may be a read-and-write memory device. However, unlike the permanent storage device 602, the system memory 604 may be a volatile read-and-write memory, such as random access memory. The system memory 604 may store any of the instructions and data that one or more processing units 614 may need at runtime. In one or more implementations, the processes of the subject disclosure are stored in the system memory 604, the permanent storage device 602, and/or the ROM 612 (which are each implemented as a non-transitory computer-readable medium). From these various memory units, the one or more processing units 614 retrieves instructions to execute and data to process in order to execute the processes of one or more implementations.

The bus 610 also connects to the input device interface 606 and the output device interface 608. The input device interface 606 enables a user to communicate information and select commands to the electronic system 600. Input devices that may be used with the input device interface 606 may include, for example, alphanumeric keyboards and pointing devices (also called "cursor control devices"). The input device interface 606 may enable, for example, the display of images generated by electronic system 600. Exemplary output devices that may be optionally used with the input device interface 606 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 15, the bus 610 also couples the electronic system 600 to one or more networks and/or to one or more network nodes, or through the one or more network interfaces 616. In this manner, the electronic system 600 can be a part of a network of computers (such as a LAN, a wide area network ("WAN"), or an Intranet, or a network of networks, such as the Internet. Any or all components of the electronic system 600 can be used in conjunction with the subject disclosure.

These functions described above can be implemented in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (also referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, and/or any other optical or magnetic media. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

Various examples of aspects of the disclosure are described below as clauses for convenience. These are provided as examples, and do not limit the subject technology.

Clause A: A base for a fan may include a first metal layer. The base may further include a second metal layer. The base may further include a core layer positioned between the first metal layer and the second metal layer, the core layer may be configured to route electrical signals to a motor.

Clause B: A fan assembly may include a cover. The fan assembly may further include a motor covered by the cover. The fan assembly may further include a base coupled to the cover and the motor. The base may include a first outer layer. The base may further include a second outer layer. The base may further include a circuit board positioned between the first outer layer and the second outer layer, the circuit board configured to route electrical signals to the motor.

Clause C: An electronic device may include a housing. The electronic device may further include a fan assembly positioned in the housing. The fan assembly may include a cover. The fan assembly may further include a motor covered by the cover. The fan assembly may further include a base coupled to the cover and the motor. The base may include a first metal layer. The base may further include a second metal layer. The base may further include a core layer positioned between the first metal layer and the second metal layer, the core layer may be configured to route electrical signals to the motor.

One or more of the above clauses can include one or more of the features described below. It is noted that any of the following clauses may be combined in any combination with each other, and placed into a respective independent clause, e.g., clause A, B, or C.

Clause 1: wherein: the core layer includes a circuit board, and the first metal layer includes openings that expose the circuit board and allow the electrical signals to the motor.

Clause 2: wherein the core layer includes a channel configured to receive a circuit that carries the electrical signals.

Clause 3: wherein: the core layer includes an extended portion that extends laterally with respect to the first metal layer, and the extended portion includes a plurality of electrical contacts for the electrical signals.

Clause 4: wherein: the first metal layer includes an opening, and the core layer is configured to receive a mounting structure at the opening.

Clause 5: wherein: the mounting structure includes a bushing configured to receive a rotor, and the core layer is electrically coupled to the rotor.

Clause 6: wherein: the mounting structure includes a threaded mount configured to receive a circuit board, and the core layer is electrically coupled to the threaded mount.

Clause 7: wherein: the first metal layer includes a first opening that includes a first diameter, the core layer includes a second opening aligned with the first opening, the second opening including the first diameter, and the second metal layer includes a third opening aligned with the second opening, the third opening including a second diameter less than the first diameter.

Clause 8: further including: a first conductive layer between the second metal layer and the core layer, and a second conductive layer between the first metal layer and the core layer.

Clause 9: wherein the first outer layer includes openings that expose the circuit board and allow the electrical signals to the motor.

Clause 10: further including a circuit, wherein: the circuit board includes a channel, and the circuit extends through the channel and is configured the electrical signals to the motor.

Clause 11: further including a motor driver circuit, wherein: the circuit board includes an extended portion that extends laterally with respect to the first outer layer, and the motor driver circuit is positioned on the extended portion.

Clause 12: further including a motor driver circuit, wherein: the first outer layer includes an opening covered by the cover, and the motor driver circuit is positioned on the circuit board at the opening.

Clause 13: further including a sidewall positioned between the cover and the base, wherein: the sidewall includes a first thickness, and the cover includes a second thickness less than the first thickness.

Clause 14: wherein: the cover includes a first structure, and the sidewall includes a second structure separate from the first structure.

Clause 15: further including a stator wherein: the core layer includes a circuit board, and the first metal layer includes openings that expose the circuit board and allow the electrical signals to the stator.

Clause 16: further including a mounting structure in contact with the core layer.

Clause 17: wherein the mounting structure is selected from a group consisting of a threaded mount or a bushing.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration". Any embodiment described herein as "exemplary" or as an "example" is not necessarily to be construed as preferred or advantageous over other embodiments. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A base for a fan, the base comprising:
a first metal layer comprising a first opening;
a second metal layer; and
a core layer positioned between the first metal layer and the second metal layer, wherein:
the core layer comprises a circuit board configured to route electrical signals to a motor, and
the first opening exposes the circuit board and allows the electrical signals to the motor.

2. The base of claim 1, wherein the core layer comprises a channel configured to receive a circuit that carries the electrical signals.

3. The base of claim 1, wherein:
the core layer comprises an extended portion that extends laterally with respect to the first metal layer, and
the extended portion comprises a plurality of electrical contacts for the electrical signals.

4. The base of claim 1, wherein:
the first metal layer comprises a second opening, and
the core layer is configured to receive a mounting structure at the second opening.

5. The base of claim 4, wherein:
the mounting structure comprises a bushing configured to receive a rotor, and
the core layer is electrically coupled to the rotor.

6. The base of claim 4, wherein:
the mounting structure comprises a threaded mount configured to receive the circuit board, and
the core layer is electrically coupled to the threaded mount.

7. The base of claim 1, wherein:
the first metal layer comprises a second opening that includes a first diameter,
the core layer comprises a third opening aligned with the second opening, the third opening including a second diameter,
the second metal layer comprises a fourth opening aligned with the first opening, the fourth opening including the second diameter, and
the second diameter is greater than the first diameter.

8. The base of claim 1, further comprising:
a first conductive layer between the second metal layer and the core layer, and
a second conductive layer between the first metal layer and the core layer.

9. A fan assembly, comprising:
a cover;
a motor covered by the cover; and
a base coupled to the cover and the motor, the base comprising:
a first outer layer comprising openings;
a second outer layer; and
a circuit board positioned between the first outer layer and the second outer layer, the circuit board configured to route electrical signals to the motor, wherein the openings expose the circuit board and allow the electrical signals to the motor.

10. The fan assembly of claim 9, further comprising a circuit, wherein:
The first outer layer and the second outer layer define a channel, and
the circuit extends through the channel and is configured the electrical signals to the motor.

11. The fan assembly of claim 9, further comprising a motor driver circuit, wherein:
the circuit board comprises an extended portion that extends laterally with respect to the first outer layer, and
the motor driver circuit is positioned on the extended portion.

12. The fan assembly of claim 9, further comprising a motor driver circuit, wherein:
the first outer layer comprises an opening covered by the cover, and
the motor driver circuit is positioned on the circuit board at the opening.

13. The fan assembly of claim 9, further comprising a sidewall positioned between the cover and the base, wherein:
the sidewall comprises a first thickness, and
the cover comprises a second thickness less than the first thickness.

14. The fan assembly of claim 13, wherein:
the cover comprises a first structure, and
the sidewall comprises a second structure separate from the first structure.

15. An electronic device, comprising:
a housing; and
a fan assembly positioned in the housing, the fan assembly comprising:
a cover;
a motor covered by the cover;
a base coupled to the cover and the motor, the base comprising:
a first metal layer;
a second metal layer; and
a core layer positioned between the first metal layer and the second metal layer, the core layer configured to route electrical signals to the motor; and a mounting structure in contact with the core layer, the mounting structure selected from a group consisting of a threaded mount or a bushing.

16. The electronic device of claim 15, further comprising a stator wherein:

the core layer comprises a circuit board, and the first metal layer comprises openings that expose the circuit board and allow the electrical signals to the stator.

\*　\*　\*　\*　\*